US005318918A

United States Patent [19]

Frazier

[11] Patent Number: 5,318,918

[45] Date of Patent: Jun. 7, 1994

[54] METHOD OF MAKING AN ARRAY OF ELECTRON EMITTERS

[75] Inventor: Gary A. Frazier, Garland, Tex.

[73] Assignee: Texas Instruments Incorporated, Dallas, Tex.

[21] Appl. No.: 814,960

[22] Filed: Dec. 31, 1991

[51] Int. Cl.[5] .................... H01L 21/335; H01L 21/283

[52] U.S. Cl. .......................................... 437/40; 437/41; 437/48; 437/186; 156/647; 156/653; 445/50

[58] Field of Search ........................ 156/647, 653, 657; 445/36, 24, 50, 51; 437/40, 41, 186, 48

[56] References Cited

U.S. PATENT DOCUMENTS

| | | | |
|---|---|---|---|
| 3,812,559 | 5/1974 | Spindt et al. | 445/24 |
| 3,970,887 | 7/1976 | Smith et al. | 313/309 |
| 4,168,213 | 9/1979 | Hoeberechts | 204/15 |
| 4,307,507 | 12/1981 | Gray et al. | 156/647 |
| 4,685,996 | 8/1987 | Busta et al. | 156/628 |
| 4,943,343 | 7/1990 | Bardai et al. | 156/643 |
| 4,964,946 | 10/1990 | Gray et al. | 156/643 |
| 5,057,047 | 10/1991 | Greene et al. | 445/24 |
| 5,147,501 | 9/1992 | Cade et al. | 156/656 |
| 5,201,992 | 4/1993 | Marcus et al. | 156/643 |
| 5,203,731 | 4/1993 | Zimmerman | 445/24 |

*Primary Examiner*—T. N. Quach
*Attorney, Agent, or Firm*—Richard A. Stoltz; James C. Kesterson; Richard L. Donaldson

[57] ABSTRACT

This is a method of forming an array of electron emitters at the face of a semiconductor layer. The method comprises the steps of depositing a layer of polycrystalline silicon on a face of a semiconductor workpiece; doping the polycrystalline silicon layer to render the polycrystalline silicon layer conductive; and for each of a plurality of emitter cells, performing an orientation-dependent polycrystalline silicon etch to define a pyramid for the cell having a base affixed to the workpiece and an upstanding tip opposed to the base. Preferably the method also includes the steps of forming a field effect transistor at the face of the workpiece prior to the depositing of the layer, with the pyramid having a base in conductive contact with the drain of the transistor. The polycrystalline silicon layer may be doped in situ after deposition.

3 Claims, 3 Drawing Sheets

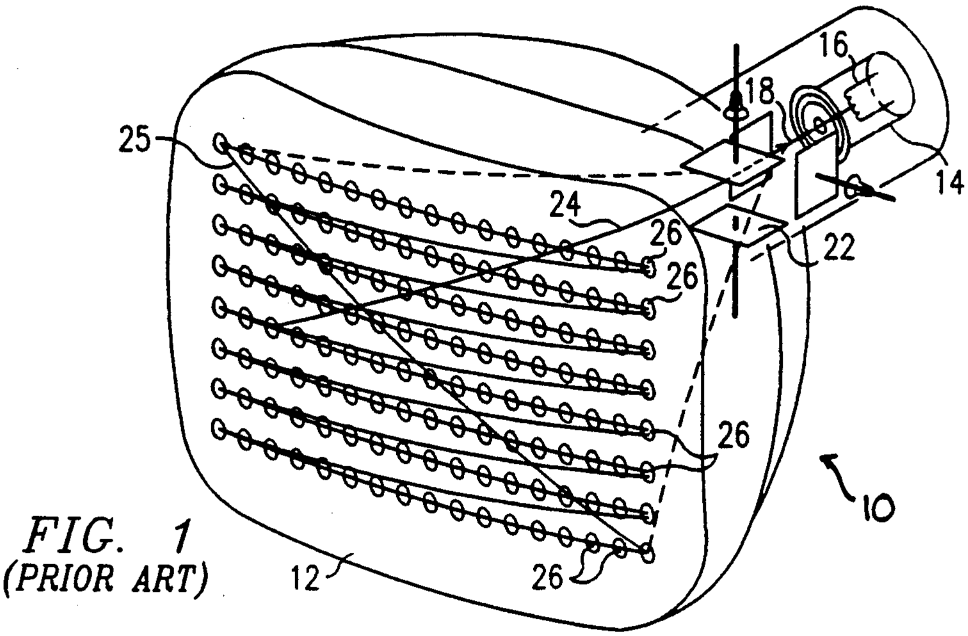
FIG. 1
(PRIOR ART)
FIG. 2
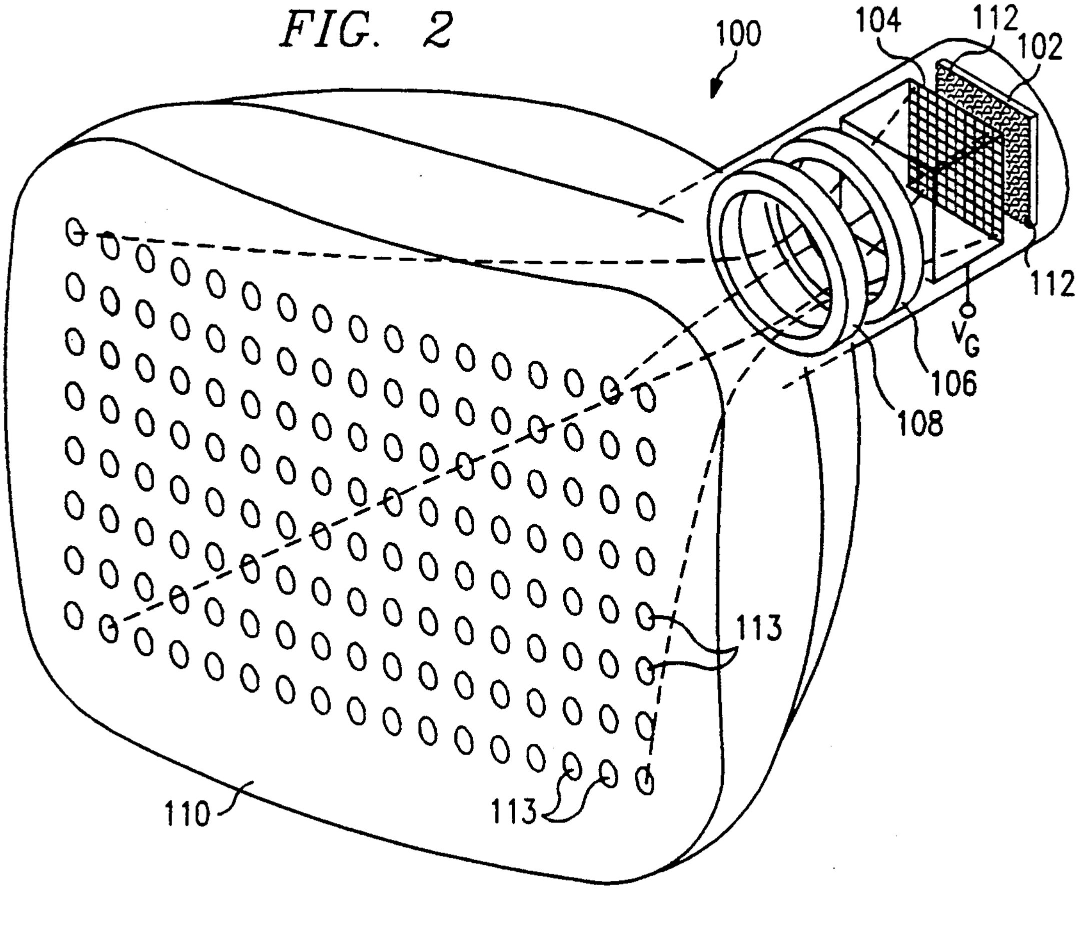

METHOD OF MAKING AN ARRAY OF ELECTRON EMITTERS

TECHNICAL FIELD OF THE INVENTION

This invention relates generally to cathode ray tubes and, more particularly, to an emitter array-based cathode ray tube.

BACKGROUND OF THE INVENTION

A conventional cathode ray tube (CRT) is equipped with an electron gun for energizing and illuminating a presentation screen. The electron gun includes a heated filament therein for emitting electrons, which will then eventually travel to the screen. Conventional CRTs also include some type of a focusing mechanism to concentrate the emitted electrons into an electron beam and a deflection mechanism to direct the electron beam to the presentation screen. The presentation screen comprises a plurality of pixels or phosphor dots,, which are arranged in rows across the screen. In color television sets, each pixel includes red, blue and green phosphor dots; in black and white television sets, there is in effect one phosphor dot per pixel. The deflection mechanism directs the electron beam from one pixel to the next, illuminating each pixel individually in a row by row manner. In this way, the entire screen is scanned by the beam to produce an image.

The quality of a dynamic video image shown on the presentation screen is affected by how rapidly the electron beam can scan the screen. A higher quality dynamic video image will be produced when scanning is rapid. However, the scanning speed in conventional CRTs is limited because the electron beam must travel long distances across the presentation screen during each scan. Moreover, the scanning speed in conventional CRTs is limited because the electron bean must be focused on each pixel for a certain "dwell" time period to impart sufficient energy to properly illuminate the phosphor dot.

Further, a typical raster-type CRT requires a great deal of current so that each of the phosphor dots on the CRT screen will be appropriately energized during the dwell time. If individual electron beams could be used to illuminate phosphor dots, the current for each of the electron beams could be much less. Further, the dynamic response of the CRT could be improved if these multiple beams could be independently modulated in intensity.

Thus, a need has arisen for a cathode ray tube that does not require the scanning of the presentation screen by an electron beam to produce visual images.

SUMMARY OF THE INVENTION

According to one aspect of the invention, an emitter-array-based cathode ray tube comprises a presentation screen having a plurality of phosphor dots. A plurality of emitters, each of the emitters corresponding to one of the dots, emit current to and illuminate the respective dots, thereby producing an image on the screen. For each of the emitters, a switch is provided for controlling current emission from the associated emitter.

According to another aspect of the invention, an electron emitter cell is provided that is formed at the face of a semiconductor layer. The cell includes a conductive, upstanding elongated shaft, the base of the shaft being joined to the face of the semiconductor layer. A free end of the shaft opposite the base has a conductive tip formed on it to enhance the field-effect emission of electrons. A low voltage supply is selectively connected to each of the shafts. When the shaft is selectively connected to the low voltage supply, and when a second voltage substantially higher than the low voltage supply is brought to within the vicinity of the tip, field emission of electrons from the shaft tip will occur.

In another aspect of the invention, each emitter may be formed, by orientation-dependent etching, as a pyramid having a base selectively connected to the low-voltage supply and an opposed, upstanding tip.

According to a further aspect of the invention, an array of such emitter tips has associated with it a memory array, such as a static random access memory, dynamic random access memory or CCD memory. Each of a plurality of cells in the memory array controls the control electrode of the pass transistor associated with each emitter. In this way, an image may be stored in the memory array and reproduced using the emitters.

A principal technical advantage of the invention is the elimination of the CRT raster pattern. Instead of a single electron beam dwelling for a predetermined period of time on each phosphor dot, a dedicated electron beam may be used to illuminate a corresponding phosphor dot on the presentation screen. This means that the electron beam can be of much less current.

Another technical advantage is that the CRT scanning time is removed as a time limitation on the speed of the CRT.

BRIEF DESCRIPTION OF THE DRAWINGS

The foregoing and additional aspects and advantages will become more apparent when the following detailed description is read in conjunction with the accompanying drawings, in which:

FIG. 1 is an isometric schematic view of a cathode ray tube according to the prior art, with internal components made visible and illustrating a raster scan pattern;

FIG. 2 is a schematic isometric view of an emitter-array-based CRT constructed in accordance with one embodiment of the invention;

DETAILED DESCRIPTION OF THE INVENTION

Figure 3:
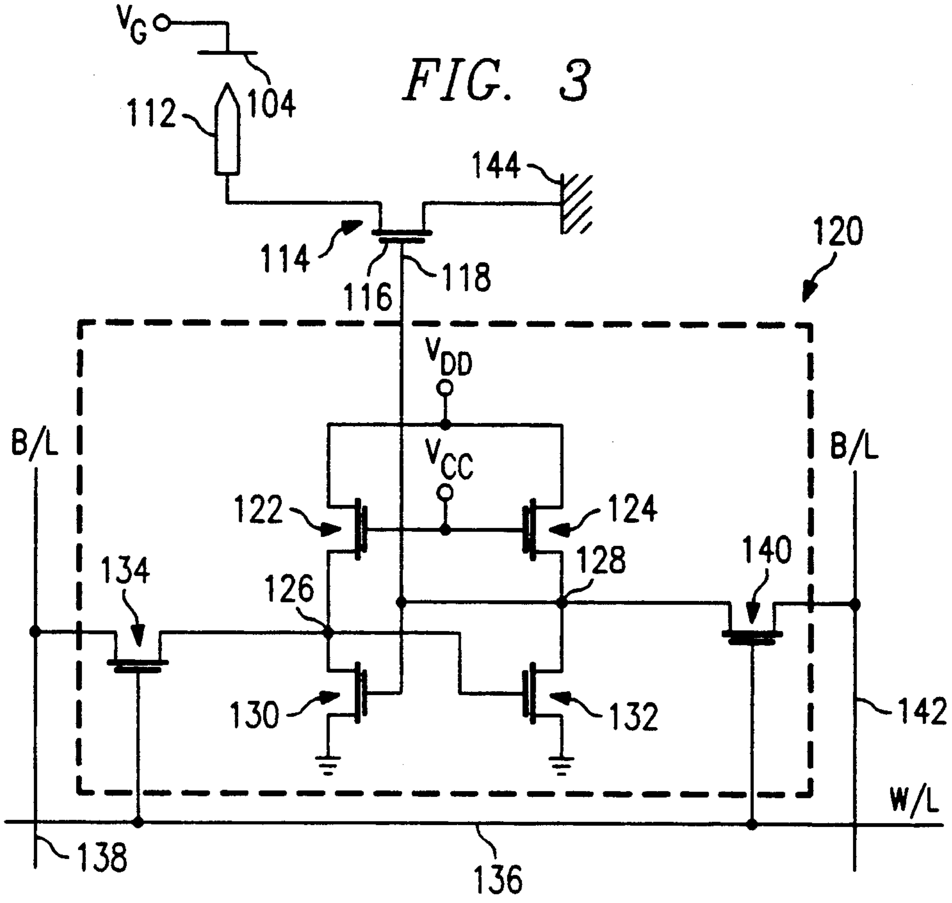
FIG. 3 is a schematic electrical diagram of a switch for an emitter tip and an associated static random access memory cell in accordance with one embodiment of the invention.

The preferred embodiment of the present invention and its advantages are best understood by referring to FIGS. 1 through 5 of the drawings, like numerals being used for like and corresponding parts of the various drawings.

FIG. 1 schematically illustrates a cathode ray tube generally indicated by reference character 10 and constructed in accordance with the prior art, with certain internal components made visible. The cathode ray tube 10 includes a presentation or display screen 12 and an electron gun 14 having a heated filament 16 therein for emitting a stream of electrons 18. The cathode ray tube 10 also includes a focusing mechanism (not shown) and a deflecting mechanism 22. The focusing mechanism is positioned next to the electron gun 14 for concentrating the stream of electrons 18 into an electron beam 24. The focusing mechanism may comprise an electrostatic lens. The electron beam 24 is then passed through the deflecting mechanism 22, which directs the beam toward the presentation screen 12. The focusing mechanism 22 may comprise pairs of electrode plates or (not shown) a magnetic deflecting coil.

The presentation screen 12 includes a plurality of phosphor dots or pixels 26, which are arranged in rows, covering the screen 12. The deflecting mechanism 22 directs the electron beam 24 to the presentation screen 12 to individually energize each phosphor dot 26. The phosphor dots are energized according to a scanning pattern 25 of the electron beam 24. The electron beam 24 moves across the screen 12, energizing each phosphor dot 26 in a row-by-row manner. Images are thereby created on the screen with each scan. A conventional CRT typically operates at 30 scans/second to create dynamic visual images.

The quality of a dynamic video image shown on the presentation screen is affected by how rapidly the electron beam can scan the screen. A higher quality dynamic video image will be produced when scanning is rapid. However, the scanning speed in conventional CRTs is limited because the electron beam must travel long distances across the presentation screen during each scan.

Additionally, the scanning speed in conventional CRTs is limited because there is significant capacitance and inductance in the scanning system, which imposes RC and R/L time constraints.

Moreover, the scanning speed in conventional CRTs is limited because the electron beam must be focused on each pixel for a certain "dwell" time period to impart sufficient energy to properly illuminate the phosphor dot. The dwell time may be reduced if high quality phosphor material is used for the phosphor dot. However, use of such material substantially increases the cost of the screen.

For these reasons, it is advantageous to have an array-based CRT having multiple electron emitters or electron beam sources that are each mated one to one with each phosphor dot on the presentation screen to continuously illuminate the phosphor dots and eliminate the need for electron beam scanning. There are a number of advantages for such an array-based CRT. First, because each emitter is linked to a phosphor dot or pixel on the screen, there is continuous current supplied to the phosphor dots eliminating the need for scanning by an electron beam. This would enable images produced on the presentation screen to be changed rapidly, thereby improving the quality of dynamic visual images.

The second advantage of such an array-based CRT is that the current required from each emitter to illuminate each phosphor dot would be substantially less than the current required from the single conventional CRT electron gun. For example, if a conventional CRT has an (e.g.) 250×250 pixel screen and operates at 30 frames/second, the dwell time or the time during which each phosphor dot is energized by the electron beam is approximately 33 milliseconds divided by $250^2$ or 528 nanoseconds. In an array-based CRT, there would be (e.g.) $250^2$ emitters and every phosphor dot would be energized continuously. Thus, the current required per emitter to illuminate a pixel is equal to the current of a single electron gun in a conventional CRT divided by $250^2$. Therefore, the high current required by a single electron gun in a conventional CRT is substantially reduced as the number of electron emitters is increased.

FIG. 2 is a schematic illustration of an emitter array-based CRT generally indicated by reference character 100 and constructed in accordance with one embodiment of the invention. The emitter array-based CRT 100 comprises an emitter base 102, a grid mechanism 104, a focusing device 106, a magnification device 108 and a presentation screen 110. A plurality of electron emitter tips 112 are formed on the emitter base 102. The emitter tips 112 comprise a conductive material having a sharp point. It has been found that such a tip configuration enables electrons to be emitted from the tip 112 under the action of a very small electric potential difference. The effect is referred to technically as electron field emission, and is similar to the phenomenon called "St. Elmo's fire".

The grid mechanism 104 is positioned near the emitter base 102. The grid 104 is connected to a voltage supply of a voltage above the voltage of the base 102 for creating an electric field between the base 102 and the grid 104. The electric field created by the grid 104 draws current or electron streams out of the emitters 112. Since a relatively low voltage $V_g$ such as 25 volts is applied to the grid 104, the current drawn from the emitter tips will be on the order of a few microamperes. However, as previously discussed, the current needed to illuminate individual phosphor dots on the screen need not be substantial since the phosphor dots will be continuously energized.

The focusing device 106 is positioned next to the grid 104 for concentrating the electron streams emitted by the tips 112 into electron beaus. The focusing mechanism 106 may comprise an electrostatic lens.

A Tensing or magnification device 108 is positioned proximate the focusing device 106 for expanding the electron beams projected by the focusing device 106. Lensing device 108 may be an electrostatic lens, as is used in conventional oscilloscopes, CRT's and scanning electron-beam microscopes, or may be an electrostatic device with magnetic assistance. The presentation screen 110 comprises a plurality of phosphor dots 113 which, in a black and white embodiment, each constitute a pixel. A black and white, or monochrome, embodiment could use alternately a uniformly coated phosphor screen. Each of the dots 113 corresponds to an emitter tip 112 so that electrons emitted by an emitter tip will energize a respective dot 113. By expanding the electron beams projected by the focusing device 106, the magnification device 108 directs the electron beams to their respective dots 113.

For color applications, selected ones of the emitter 112 are encoded to convey "red", "green" or "blue" information. Each of the color-encoded emitters 112 correspond to a red, green or blue phosphor dot 113. In a color embodiment, a pixel would be constituted by adjacent red, green and blue phosphor dots 113. One advantage in the invention is that, contrary to usual color television practice, no shadow mask is necessary to separate the color electron beams one from another in the illumination of a pixel.

It should be noted that the magnification device may be replaced with a de-magnification device in the event the presentation screen is smaller than the array of emitter tips.

FIG. 3 illustrates a switch mechanism generally indicated at 114 for an emitter tip 112. The switch 114 comprises a field effect transistor which either allows or prevents charge from leaving the tip 112 by making this a low conductive path to ground or a high resistance path to ground, respectively. A gate 116 of the FET transistor switch 114 may be coupled to appropriate selection circuitry by a select line 118.

In one embodiment, the array 102 is constituted by a plurality of emitter tips 112 and, within the same semiconductor layer, a plurality of respective switching transistors 114. Each select line 118 may, for example, be coupled to an SRAM memory cell such as the one indicated generally at 120.

In the embodiment illustrated in FIG. 3, the SRAM cell 120 is a conventional six-transistor SRAM cell. N-channel field effect transistors 122 and 124 have their respective gates connected to a control voltage $V_{gg}$ and their drains coupled to a high supply voltage $V_{dd}$. The source of transistor 122 is connected to a node 126 while the source of transistor 124 is connected to a node 128.

An n-channel field effect transistor 130 has a drain connected to the node 126, while its source is connected to $V_{ss}$ or ground. A gate of n-channel field effect transistor 130 is connected to node 28. An n-channel field effect transistor 132 has a drain connected to node 128, a source connected to $V_{ss}$ or ground, and a gate cross-coupled to the node 126. An n-channel field effect transistor 134 has a gate connected to a wordline 136 and a current path which selectively connects node 126 to a bit line 138. An n-channel field effect transistor 140 has a gate which is connected to the wordline 136 and a current path which selectively connects node 128 to a bitline 142. In storing one of two binary states, at any one time one of transistors 130 and 132 will be turned on and the other will be turned off. This in turn will affect the voltage state at node 128. Because line 118 connects the state of the cell 122 to the gate 116 of the field effect pass transistor 114, the state of cell 120 is effectively used to selectively connect the emitter 112 to a low voltage source or ground 144. When the current path of pass transistor 114 is rendered conductive, electrons will proceed from $V_{ss}$ or ground source 144, through the current path, to the emitter 112, and a stream of electrons will then be emitted from tip 112 toward grid 104. In the embodiment illustrated in FIG. 3, one cell 120 is accorded for each emitter 112, such that an entire image may be stored in a memory array of cells 120 which corresponds to an array of the emitters 112.

Figure 4:
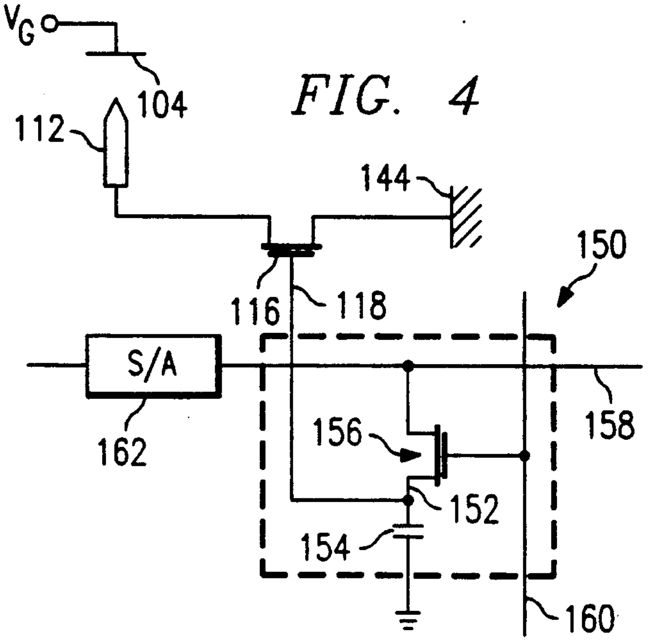
FIG. 4 is a schematic electrical diagram of a switch for an emitter tip and an associated dynamic random access memory cell according to another embodiment of the invention.

An alternative embodiment is illustrated by the schematic electrical diagram of FIG. 4. In this embodiment, the SRAM cell 120 is replaced with a dynamic random access memory (DRAM) cell indicated generally at 150 by the dashed enclosure. The control line 118 is connected to a node 152. Node 152 is connected to one electrode of a storage capacitor 154, the other electrode of which is connected to ground. Node 152 is connected by the current path of a pass transistor 156 to a bitline half 158. A gate of the field effect pass transistor 156 is connected to a wordline 160. Bitline 158 is connected to a sense amplifier 162, which typically will be connected to another bitline half. A plurality of other cells 150 (not shown) are connected to each of the bitline halves 158 in an array of cells 150. In order for the embodiment shown in FIG. 4 to operate, line 118 will have to energized to a voltage that is at least above the threshold voltage of pass transistor 116 for a time that is at least as long as the period between refresh cycles of the DRAM memory array. This may be accomplished by increasing the size of capacitor 154 over that usually associated with DRAM cells, or increasing the refresh rate so that a suitable amount of voltage remains on line 118. Since the refresh rate is orders of magnitude more than the frame speed, this presents no problem.

In another embodiment (not shown) the memory array associated with the emitter array 102 (FIG. 2) may be a plurality of CCD registers.

Figure 5:
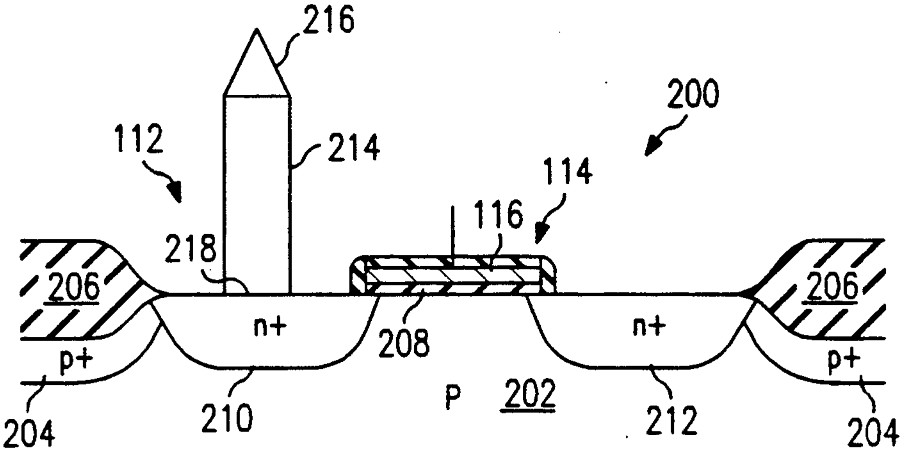
FIG. 5 is a highly magnified schematic sectional view of an emitter tip and associated field-effect pass transistor in accordance with one embodiment of the invention.

FIG. 5 is a highly magnified schematic sectional view of a single emitter cell indicated generally at 200. A repetition of emitter cells 200 is used to constitute the emitter array 102 (FIG. 3). On a suitable semiconductor substrate, a (p−) epitaxial layer 202 is grown. In order to isolate the cell 200 from adjacent cells, a channel stop implant may be performed to create (p+) channel stop regions 204. A hard mask is employed to mask off an active device area for the cell 200. The wafer is then subjected to an oxygen atmosphere for a relatively long period of time at an elevated temperature to create LOCOS field oxide regions 206.

After the LOCOS oxide regions 206 are created, the hard mask is stripped and a gate oxide layer 208 is grown on the exposed portions of the silicon layer 202. Thereafter, a layer of polycrystalline silicon is deposited, patterned and etched to define a field effect pass transistor gate 116. The gate oxide 208 may be etched at the same time in a stack etch.

After definition of the poly gate 116, an implant may be performed to create (n+) drain region 210 and (n+) source region 212. Source region 212 may be connected at a point out of the sectional plane to a $V_{ss}$ source 144 (FIG. 3).

The emitter 112 has two components: a doped polycrystalline silicon conductive column or shaft 214 and a conductive tip 216. A base 218 of the shaft 214 is conductively coupled to the drain 210, or other semiconductor device site, and is affixed to the epitaxial layer 202. The tip 216 may comprise tungsten or platinum-iridium which may be formed, for example, by a known wet etch which will automatically create pointed tungsten or Pl-Ir features based upon the orientation of the crystal at the time that it is patterned, masked and etched.

The preferred electrolytic etching method for forming the sharp tip 216 is as follows. The circuit in FIG. 5 is fabricated through the previously described processing steps and to include the formation of a vertical column of tungsten on top of column 214, and having an electrically conductive polymer such as doped polyamide is then deposited over the entire chip by any conventional method such as spinning and then planar plasma etched conventionally so as to expose only the tungsten columns above the polymer overcoat. An electrode is attached to some portion of the conductive polymer to serve as a cathode connection in an electrolytic polishing bath. The chip is placed in a solution about 5% potassium hydroxide and 95% water by weight, and electrolytically etched using about 5 to about 15 A.C. volts applied to the chip electrode and a stainless steel counter (anode) electrode. The electrolytic etch is allowed to proceed until the desired sharpness of the array of tungsten tips has been produced. After forming the sharp tips 216, the conductive polymer is removed by chemical dissolution or plasma etching.

If platinum-iridium alloy is used for tip 216, the electrolytic etchant should be composed of about 60% calcium chloride, 36% water and about 4% hydrochloric acid by weight. The etch voltage should be in the range of about 5 to about 15 volts A.C., inclusive.

A contact is made to the polysilicon gate 116 to line 118 (FIGS. 3 and 4) in a conventional manner.

Figure 6:
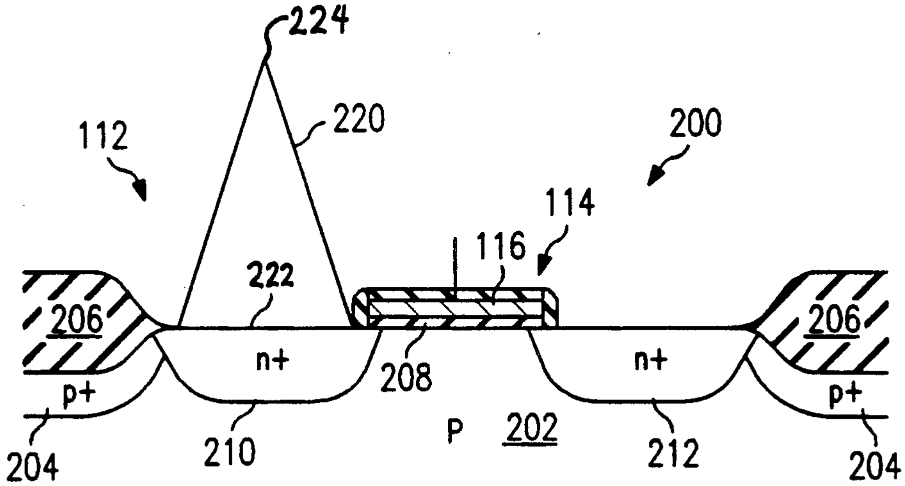
FIG. 6 is a highly magnified schematic sectional view of an emitter tip and associated field-effect pass transistor in accordance with an alternative embodiment of the invention.

In an alternative embodiment shown in FIG. 6, the array 102 may be fabricated by starting with a <100> orientation silicon substrate; forming the gate oxide 208 and polysilicon gate 116; implanting drain 210 and source 212; insulating the polysilicon gate 116 with sidewall oxide and cap oxide; burying the active device area with a second layer of doped polycrystalline silicon to a depth of about ten thousand Angstroms; thermally annealing the polycrystalline top layer to form <100> oriented silicon over region 210; masking the polysilicon over region 210; and back-etching the second polycrystalline silicon layer with orientation dependent etching (ODE), to create a plurality of pyramidal emitters 220, one emitter for each drain 210. Hydrochloric acid can be used for the ODE etch. A base 222 of the emitter 220 is disposed on the drain 210, and the emitter tip is formed by a tip 224 of pyramid 220. Tip 224 is upstanding and remote from base 220. After the ODE etch, contacts would be made to each of the poly gates 116, the polycrystalline is preferably doped in situ with a gaseous dopant such as $POCl_3$.

In another alternative embodiment, the source 212 of either FIG. 5 or FIG. 6 may be shared by another drain 210 and another gate 116, such that there would be one source 212 for each of a pair of emitter cells 200.

Although the present invention and its advantages have been described in detail, it should be understood that various changes, substitutions and alterations can be made herein without departing from the spirit and scope of the invention as defined by the appended claims.

What is claimed is:

1. A method of forming an array of electron emitters at a face of a semiconductor layer, comprising the steps of:

depositing a layer of polycrystalline silicon on a face of a semiconductor workpiece;

doping the polycrystalline silicon layer to render the polycrystalline silicon layer conductive; and for each of a plurality of emitter cells, performing an orientation-dependent polycrystalline silicon etch to define a pyramid for said cell having a base affixed to the workpiece and an upstanding tip opposed to the base.

2. The method of claim 1, and further comprising the steps of:

prior to said step of depositing the layer of polycrystalline silicon, forming, for each cell, a field-effect transistor at a face of the workpiece to have a gate, source and drain; and for each cell, defining a respective pyramid having a base in conductive contact with a drain of the transistor.

3. The method of claim 1, and further comprising the step of doping the layer of polycrystalline silicon in situ after the layer has been deposited.

* * * * *